United States Patent
Ohyama et al.

(10) Patent No.: US 10,175,404 B2
(45) Date of Patent: Jan. 8, 2019

(54) COMPENSATION FILM AND DISPLAY DEVICE INCLUDING THE SAME

(71) Applicant: SAMSUNG ELECTRONICS CO., LTD., Suwon-si, Gyeonggi-do (KR)

(72) Inventors: Tsuyoshi Ohyama, Suwon-si (KR); Kitae Park, Suwon-si (KR); Hyunseok Choi, Anyang-si (KR); Koh Kamada, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 170 days.

(21) Appl. No.: 15/189,631

(22) Filed: Jun. 22, 2016

(65) Prior Publication Data

US 2017/0212288 A1    Jul. 27, 2017

(30) Foreign Application Priority Data

Jan. 27, 2016    (KR) .................. 10-2016-0010190

(51) Int. Cl.
*G02B 5/30* (2006.01)
*G02F 1/13363* (2006.01)
*H01L 27/32* (2006.01)

(52) U.S. Cl.
CPC ......... *G02B 5/3083* (2013.01); *G02B 5/3016* (2013.01); *G02F 1/13363* (2013.01); *H01L 27/3232* (2013.01); *G02F 2001/133631* (2013.01); *G02F 2001/133633* (2013.01); *G02F 2203/05* (2013.01)

(58) Field of Classification Search
CPC . G02B 5/3083; G02B 5/3016; G02F 1/13363; G02F 1/133634; G02F 2001/133631; G02F 2001/133633; G02F 2001/133637; G02F 2413/02; G02F 2413/06; G02F 2413/09–2413/12
See application file for complete search history.

(56) References Cited

U.S. PATENT DOCUMENTS

| 6,565,974 | B1 | 5/2003 | Uchiyama et al. |
| 8,066,905 | B2 | 11/2011 | Suemasu |
| 8,767,151 | B2 | 7/2014 | Chang et al. |
| 2006/0177607 | A1* | 8/2006 | Ohmori ............ C08J 5/18 428/1.31 |

(Continued)

FOREIGN PATENT DOCUMENTS

| JP | 3325560 B2 | 7/2002 |
| JP | 2009500646 A | 1/2009 |

(Continued)

*Primary Examiner* — Angela K Davison
(74) *Attorney, Agent, or Firm* — Cantor Colburn LLP

(57) ABSTRACT

An optical film includes a first compensation film and a second compensation film having a retardation for incident light different from the first compensation film, wherein the first compensation film includes a first liquid crystal layer including liquid crystals which are obliquely tilted relative to a surface of the first compensation film, and the second compensation film has a refractive index satisfying Relationship Equation 1 and Relationship Equation 2.

$n_{z2} > n_{x2}$    Relationship Equation 1

$n_{z2} > n_{y2}$    Relationship Equation 2

17 Claims, 8 Drawing Sheets

(56) References Cited

U.S. PATENT DOCUMENTS

| | | | |
|---|---|---|---|
| 2006/0221286 A1* | 10/2006 | Allen | G02B 5/3083 |
| | | | 349/121 |
| 2006/0285039 A1 | 12/2006 | Nam | |
| 2009/0128718 A1 | 5/2009 | Nakagawa | |
| 2010/0072422 A1 | 3/2010 | Parri et al. | |
| 2013/0342793 A1* | 12/2013 | Takeda | G02F 1/133634 |
| | | | 349/96 |
| 2014/0225288 A1 | 8/2014 | Haida et al. | |
| 2015/0049284 A1 | 2/2015 | Jung et al. | |

FOREIGN PATENT DOCUMENTS

| | | |
|---|---|---|
| JP | 4548726 B2 | 7/2010 |
| JP | 2010522892 A | 7/2010 |
| JP | 2015135525 A | 7/2015 |
| KR | 1020150019361 A | 2/2015 |

\* cited by examiner

COMPENSATION FILM AND DISPLAY DEVICE INCLUDING THE SAME

CROSS-REFERENCE TO RELATED APPLICATION

This application claims priority to and the benefit of Korean Patent Application No. 10-2016-0010190 filed in the Korean Intellectual Property Office on Jan. 27, 2016, and all the benefits accruing therefrom under 35 U.S.C. § 119, the entire contents of which are incorporated herein by reference.

BACKGROUND

1. Field

A compensation film and a display device including the compensation film are disclosed.

2. Description of the Related Art

Flat panel displays may be classified into a light-emitting display device capable of emitting light by itself and a non-emissive display device requiring a separate light source. A compensation film may be employed for improving the image quality of the flat panel display.

However, compensation films may have a strong viewing angle dependency, where visibility may be deteriorated toward the side direction.

SUMMARY

An embodiment provides an optical film capable of improving image quality of a display device by decreasing viewing angle dependency.

Another embodiment provides a display device including the optical film.

According to an embodiment, an optical film includes a first compensation film and a second compensation film having a retardation for incident light different from the first compensation film, wherein the first compensation film includes a first liquid crystal layer including liquid crystals which are obliquely tilted relative to a surface of the first compensation film and the second compensation film has a refractive index satisfying Relationship Equations 1 and 2.

$$n_{z2} > n_{x2} \quad \text{Relationship Equation 1}$$

$$n_{z2} > n_{y2} \quad \text{Relationship Equation 2}$$

In Relationship Equations 1 and 2,
$n_{x2}$ is a refractive index at a slow axis of the second compensation film,
$n_{y2}$ is a refractive index at a fast axis of the second compensation film, and
$n_{z2}$ is a refractive index in a direction perpendicular to the slow axis and the fast axis of the second compensation film.

The first liquid crystal layer may have a first surface and a second surface, and tilt angles of the liquid crystals may be gradually larger from the first surface to the second surface.

The tilt angles of the liquid crystals may be greater than about 0° and less than or equal to about 60°.

The tilt angles of the liquid crystals may be greater than about 0° and less than or equal to about 45°.

The first surface of the first liquid crystal layer may be disposed at a surface of the second compensation film.

The second surface of the first liquid crystal layer may be disposed at a surface of the second compensation film.

The first compensation film may further include an alignment layer contacting the first liquid crystal layer.

The first compensation film may have an in-plane retardation for incident light of about 110 nanometers (nm) to about 160 nm.

In-plane retardation for incident light of the first liquid crystal layer at 450 nm, 550 nm, and 650 nm wavelengths may satisfy Relationship Equations 3 or 4.

$$R_{e1}(450\text{ nm}) < R_{e1}(550\text{ nm}) \leq R_{e1}(650\text{ nm}) \quad \text{Relationship Equation 3}$$

$$R_{e1}(450\text{ nm}) \leq R_{e1}(550\text{ nm}) < R_{e1}(650\text{ nm}) \quad \text{Relationship Equation 4}$$

In Relationship Equations 3 and 4,
$R_{e1}$ (450 nm) is in-plane retardation of the first liquid crystal layer for incident light at a 450 nm wavelength,
$R_{e1}$ (550 nm) is in-plane retardation of the first liquid crystal layer for incident light at a 550 nm wavelength, and
$R_{e1}$ (650 nm) is in-plane retardation of the first liquid crystal layer for incident light at a 650 nm wavelength.

In-plane retardation for incident light of the first liquid crystal layer at 450 nm, 550 nm, and 650 nm wavelengths may satisfy Relationship Equation 5.

$$0.7 \leq R_{e1}(450\text{ nm})/R_{e1}(550\text{ nm}) < 1.0 \quad \text{Relationship Equation 5}$$

In Relationship Equation 5,
$R_{e1}$ (450 nm) is in-plane retardation of the first liquid crystal layer for incident light at a 450 nm wavelength, and
$R_{e1}$ (550 nm) is in-plane retardation of the first liquid crystal layer for incident light at a 550 nm wavelength.

The second compensation film may be an elongated polymer film.

The second compensation film may include a second liquid crystal layer including homeotropic liquid crystals.

The second liquid crystal layer may have an in-plane retardation satisfying Relationship Equations 6 and 7.

$$-10\text{ nm} \leq R_{e2}(550\text{ nm}) \leq 10\text{ nm} \quad \text{Relationship Equation 6}$$

$$-200\text{ nm} \leq R_{th2}(550\text{ nm}) < -10\text{ nm} \quad \text{Relationship Equation 7}$$

In Relationship Equations 6 and 7,
$R_{e2}$ (550 nm) is in-plane retardation of the second liquid crystal layer for incident light at a 550 nm wavelength, and
$R_{th2}$ (550 nm) is a thickness direction retardation of the second liquid crystal layer for incident light at a 550 nm wavelength.

In-plane retardation for incident light of the second liquid crystal layer at 450 nm, 550 nm, and 650 nm wavelengths may satisfy any one of Relationship Equations 8 to 11.

$$R_{e2}(450\text{ nm}) > R_{e2}(550\text{ nm}) \geq R_{e2}(650\text{ nm}) \quad \text{Relationship Equation 8}$$

$$R_{e2}(450\text{ nm}) \geq R_{e2}(550\text{ nm}) > R_{e2}(650\text{ nm}) \quad \text{Relationship Equation 9}$$

$$R_{e2}(450\text{ nm}) < R_{e2}(550\text{ nm}) \leq R_{e2}(650\text{ nm}) \quad \text{Relationship Equation 10}$$

$$R_{e2}(450\text{ nm}) \leq R_{e2}(550\text{ nm}) < R_{e2}(650\text{ nm}) \quad \text{Relationship Equation 11}$$

In Relationship Equations 8 to 11,
$R_{e2}$ (450 nm) is in-plane retardation of the second liquid crystal layer for incident light at a 450 nm wavelength,
$R_{e2}$ (550 nm) is in-plane retardation of the second liquid crystal layer for incident light at a 550 nm wavelength, and
$R_{e2}$ (650 nm) is in-plane retardation of the second liquid crystal layer for incident light at a 650 nm wavelength.

The optical film may further include a polarizer on the first compensation film or on the second compensation film.

According to another embodiment, a display device includes a display panel and the optical film.

The display panel may be a liquid crystal panel, and the liquid crystal panel may include a first panel and a second panel facing each other and a liquid crystal layer between the first and second panels and including liquid crystals rotating in an in-plane direction of the panels when an electric field is present in the display device.

The display panel may be an organic light emitting display panel.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
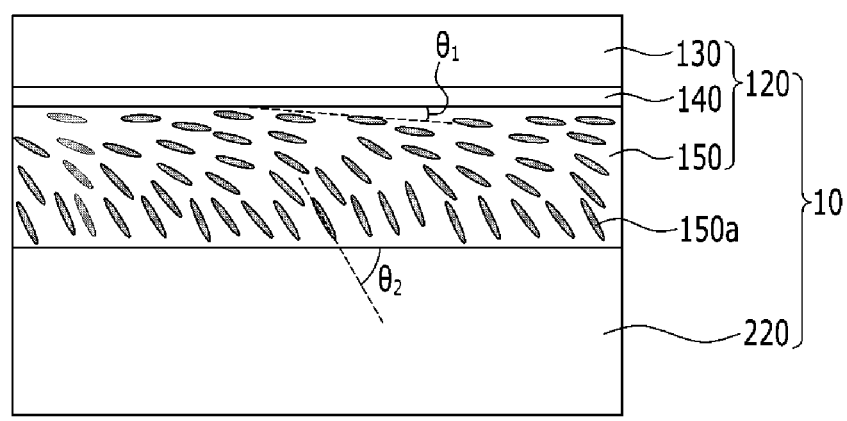
FIG. 1 is a cross-sectional view of an optical film according to an embodiment.

Exemplary embodiments will hereinafter be described in detail, and may be easily performed by those who have common knowledge in the related art. However, this disclosure may be embodied in many different forms and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, an optical film according to exemplary embodiments is described with reference to the drawings.

FIG. 1 is a schematic cross-sectional view showing an optical film according to an embodiment.

Referring to FIG. 1, an optical film 10 according to an embodiment includes a first compensation film 120 and a second compensation film 220 having a retardation for incident light different from one another.

The first compensation film 120 may circularly polarize light to generate retardation of the light, and may be, for example, a λ/4 plate. The λ/4 plate may have in-plane retardation of, for example, about 110 nm to about 160 nm for incident light at a 550 nm wavelength (hereinafter, referred to as 'reference wavelength').

The first compensation film 120 includes a substrate 130, an alignment layer 140, and a liquid crystal layer (hereinafter, referred to as "first liquid crystal layer") 150.

The substrate 130 may be, for example, a glass substrate or a polymer substrate, and the polymer substrate may include, for example, polyethylene terephthalate (PET), polyvinyl alcohol (PVA), polycarbonate (PC), triacetyl cellulose (TAC), a derivative thereof, or a combination thereof, but is not limited thereto. When the first compensation film 120 includes another lower layer in addition to the substrate, the substrate 130 may be the lower of the two layers. The substrate 130 may be omitted as needed.

The alignment layer 140 may impart a pretilt angle to liquid crystals 150a of the first liquid crystal layer 150 and thereby control the alignment of the liquid crystals. The alignment layer 140, for example, may be include polyvinyl alcohol, polyolefin, polyamic acid, polyimide, or a combination thereof. The surface of the alignment layer 140 may have a plurality of grooves formed through a physical treatment such as rubbing the surface of the alignment layer or a photo-treatment such as photo-alignment.

The first liquid crystal layer 150 includes a plurality of liquid crystals 150a obliquely tilted with respect to the surface of the first liquid crystal layer 150. As used herein, the "obliquely tilted" with respect to the surface of the first liquid crystal layer 150 may mean that the liquid crystals are not perpendicularly nor horizontally aligned with respect to the surface of the first liquid crystal layer 150, and each liquid crystal 150a is tilted at an angle of greater than about 0° and less than about 90° with respect to the first liquid crystal layer 150. Within this range, each liquid crystal 150a may be, for example, tilted at an angle of greater than about 0° and less than or equal to about 60°, for example greater than about 0° and less than or equal to about 45°.

An angle at which the liquid crystal 150a is tilted with respect to the surface of the first liquid crystal layer 150 (hereinafter referred to as 'a tilt angle') may change along the thickness direction of the first liquid crystal layer 150. For example, the tilt angle of the first liquid crystals 150a may gradually change along the thickness direction of the first liquid crystal layer 150.

The first liquid crystal layer 150 has a structure in which a tilt angle of the liquid crystals is larger from the top of the liquid crystal layer to the bottom of the liquid crystal layer, for example, a bottom tilt structure. For example, when the first liquid crystal layer 150 has a first surface contacting the alignment layer 140 and a second surface opposite the first surface, the liquid crystals 150a have a tilt angle that gradually increases from the first surface to the second surface. For example, when the first liquid crystal layer 150 has a first surface contacting the alignment layer 140 and a second surface contacting the second compensation film 220, the tilt angle of the liquid crystals 150a may become gradually larger from the first surface to the second surface.

For example, the tilt angle $\theta_1$ of the liquid crystals 150a at the first surface of the first liquid crystal layer 150 may be a pretilt angle generated by the alignment layer 140. The tilt angle $\theta_1$ for example, may range from greater than about 0° to less than or equal to about 20°. The tilt angle $\theta_1$ may be, for example, in a range of greater than about 0° and less than or equal to about 15°, greater than about 0° and less than or equal to about 10°, greater than about 0° and less than or equal to about 5°, or from about 2° to about 5°.

The tilt angle $\theta_2$ of the liquid crystals 150a at the second surface of the first liquid crystal layer 150 may be a maximum tilt angle, for example, in a range of about 3° to about 80°. The maximum tilt angle may be, for example, an angle in a range of about 3° to about 75°, about 3° to about 70°, about 3° to about 60°, or about 3° to about 45°.

The first compensation film 120 may have retardation. The retardation of the first compensation film 120 may be substantially the same as the retardation of the first liquid crystal layer 150.

The retardation of the first liquid crystal layer 150 may be an in-plane retardation ($R_{e1}$), and the in-plane retardation ($R_{e1}$) of the first liquid crystal layer 150 may be expressed as $R_{e1}=(n_{x1}-n_{y1})d_1$. Herein, $n_x$ is a refractive index in a direction having the highest refractive index in a plane of the first liquid crystal layer 150 (hereinafter referred to as "a slow axis"), $n_y$ is a refractive index in a direction having the lowest refractive index in a plane of the first liquid crystal layer 150 (hereinafter referred to as "a fast axis"), and d is a thickness of the first liquid crystal layer 150.

Retardation having small reflectance and color sense change from the side direction may be controlled by altering the tilt angle θ2 of the liquid crystals 150a at the second surface of the first liquid crystal layer 150.

The first compensation film 120 may have a reverse wavelength dispersion retardation. The reverse wavelength dispersion retardation has larger retardation of light having a long wavelength as compared to retardation of light having a short wavelength. When a 550 nm wavelength is a reference wavelength, in-plane retardation of the first liquid crystal layer 150 at 450 nm, 550 nm, and 650 nm wavelengths may satisfy, for example Relationship Equation 3 or 4.

$$R_{e1}(450\ nm)<R_{e1}(550\ nm)\leq R_{e1}(650\ nm) \quad \text{Relationship Equation 3}$$

$$R_{e1}(450\ nm)\leq R_{e1}(550\ nm)<R_{e1}(650\ nm) \quad \text{Relationship Equation 4}$$

In Relationship Equations 3 and 4, $R_{e1}$ (450 nm) is in-plane retardation of the first liquid crystal layer for incident light at a 450 nm wavelength, $R_{e1}$ (550 nm) is in-plane retardation of the first liquid crystal layer for incident light at a 550 nm wavelength, and $R_{e1}$ (650 nm) is in-plane retardation of the first liquid crystal layer for incident light at a 650 nm wavelength.

Retardation of the first liquid crystal layer 150 in a short wavelength region, for example 450 nm and 550 nm wavelengths may be expressed as a ratio of in-plane retardation ($R_{e1}$), and the first liquid crystal layer 150 may satisfy, for example Relationship Equation 5.

$$0.7\leq R_{e1}(450\ nm)/R_{e1}(550\ nm)<1.0 \quad \text{Relationship Equation 5}$$

In Relationship Equation 5, $R_{e1}$ (450 nm) is in-plane retardation of the first liquid crystal layer for incident light at a 450 nm wavelength, and $R_{e1}$ (550 nm) is in-plane retardation of the first liquid crystal layer for incident light at a 550 nm wavelength.

For example, the retardation of the first liquid crystal layer 150 in a short wavelength region may satisfy, for example Relationship Equation 5a.

$$0.72\leq R_{e1}(450\ nm)/R_{e1}(550\ nm)\leq 0.92 \quad \text{Relationship Equation 5a}$$

For example, the retardation of the first liquid crystal layer 150 in a short wavelength region may satisfy, for example Relationship Equation 5b.

$$0.75\leq R_{e1}(450\ nm)/R_{e1}(550\ nm)\leq 0.90 \quad \text{Relationship Equation 5b}$$

For example, the retardation of the first liquid crystal layer 150 in a short wavelength region may satisfy, for example Relationship Equation 5c.

$$0.80 \leq R_{e1}(450 \text{ nm})/R_{e1}(550 \text{ nm}) \leq 0.85 \quad \text{Relationship Equation 5c}$$

The first liquid crystal layer 150 includes a plurality of the tilted liquid crystals 150a, and the tilt angles of the liquid crystals 150a increase along the thickness direction of the first liquid crystal layer 150, and accordingly light may be circularly-polarized equally in all directions, a contrast ratio is improved at the side direction as well as in the front direction, and generation of color shift is decreased, resulting in improved side-direction visibility.

The liquid crystal 150a may have a rod shape aligned in one direction, and may be, for example, a monomer, an oligomer, or a polymer. The liquid crystal 150a may have, for example, positive or negative birefringence values ($\Delta n$).

The liquid crystal 150a may be a reactive mesogenic liquid crystal, and may include, for example, at least one mesogenic moiety and at least one polymerizable functional group. The reactive mesogenic liquid crystal may include, for example, a rod-shaped aromatic derivative having at least one polymerizable functional group, propylene glycol 1-methyl, propylene glycol 2-acetate or a compound represented by $P^1$-$A^1$-$(Z^1$-$A^2)_n$-$P^2$ (wherein $P^1$ and $P^2$ are a polymerizable functional group and are independently acrylate, methacrylate, acryloyl, vinyl, vinyloxy, epoxy, or a combination thereof, $A^1$ and $A^2$ independently may be 1,4-phenylene or a naphthalene-2,6-diyl group, $Z^1$ may be a single bond, —COO—, or —OCO—, and n is 0, 1 or 2), but is not limited thereto.

The liquid crystal 150a may be a thermosetting liquid crystal or a photocurable liquid crystal, and for example, the liquid crystal 150a may be a photocurable liquid crystal. When the liquid crystal 150a is a photocurable liquid crystal, the light may be ultraviolet light having a wavelength ranging from about 250 nm to about 400 nm.

For example, the liquid crystal 150a may be cross-linkable liquid crystals. For example, the liquid crystal 150a may be a compound represented by any one of Chemical Formulae 1A to 1F.

Chemical Formula 1A

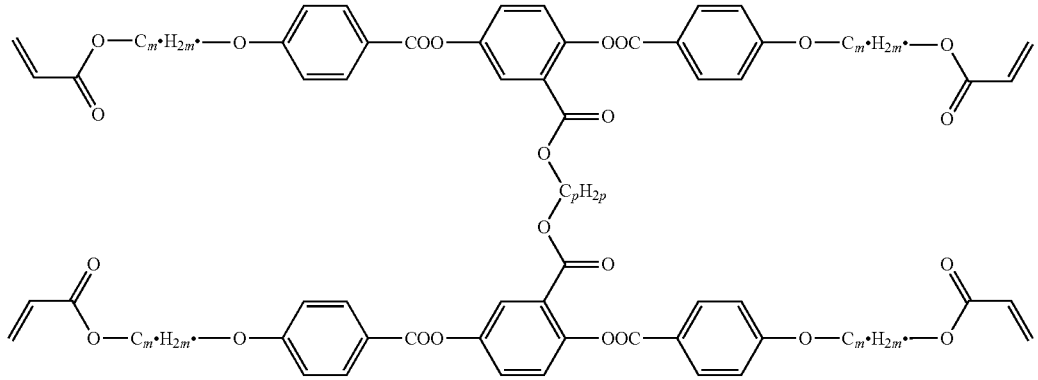

Chemical Formula 1B

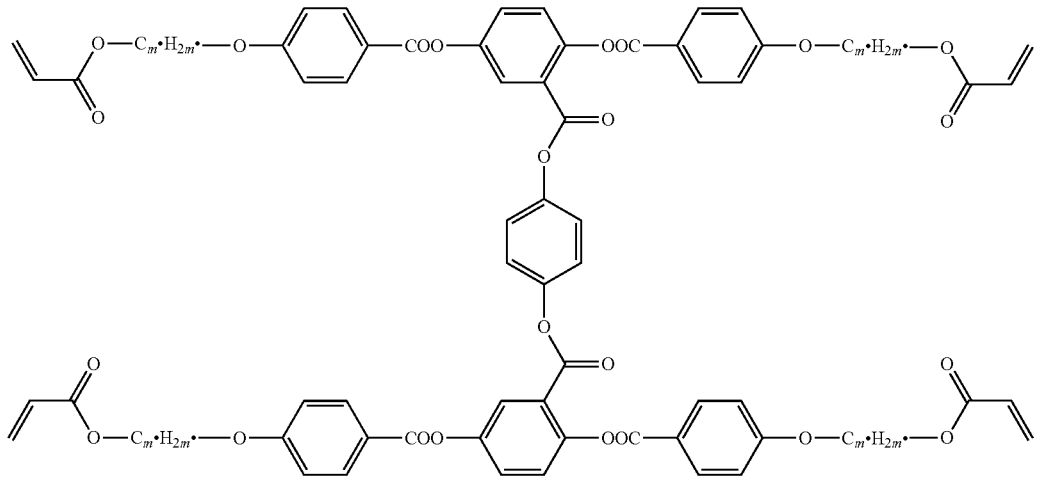

Chemical Formula 1C
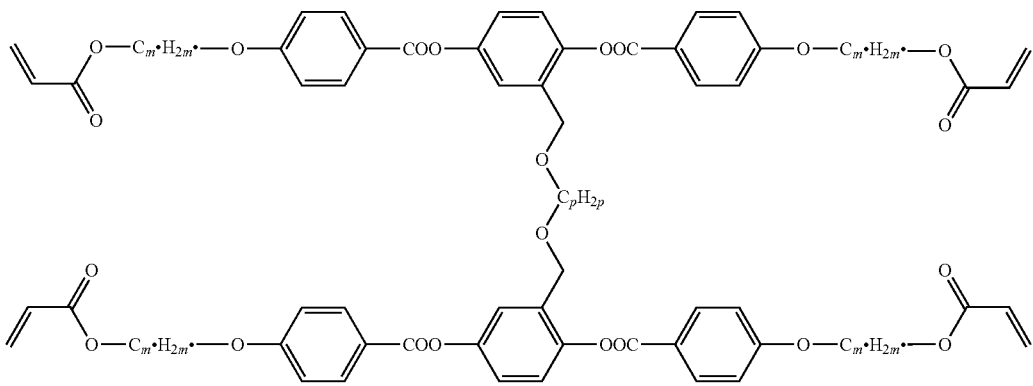
Chemical Formula 1D
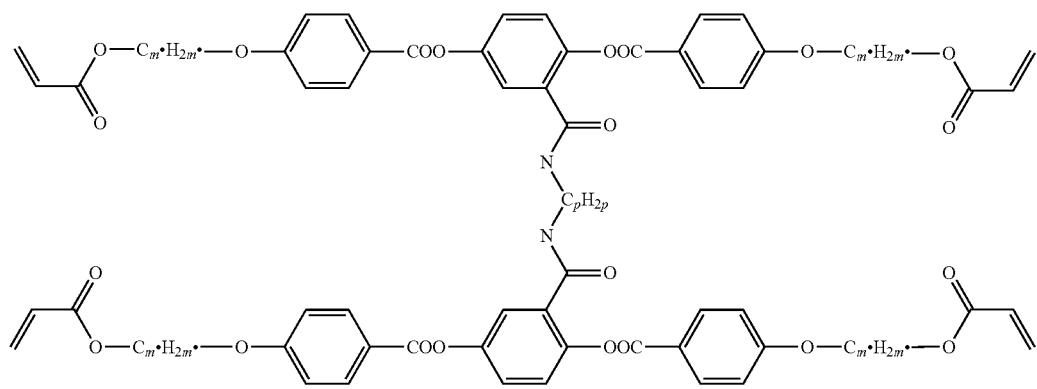
Chemical Formula 1E
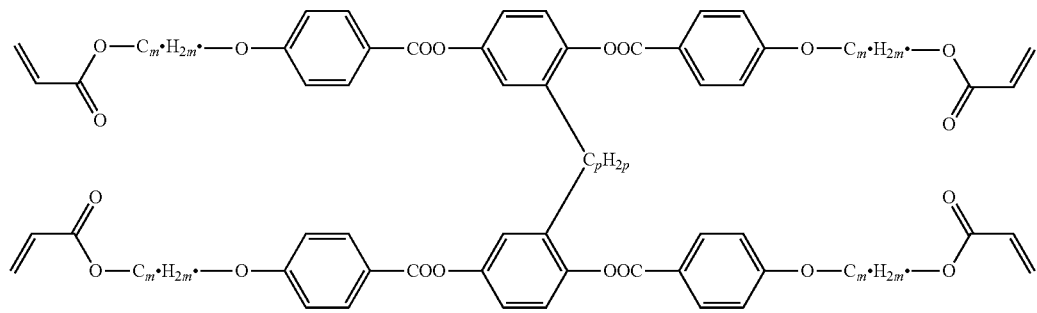

Chemical Formula 1F
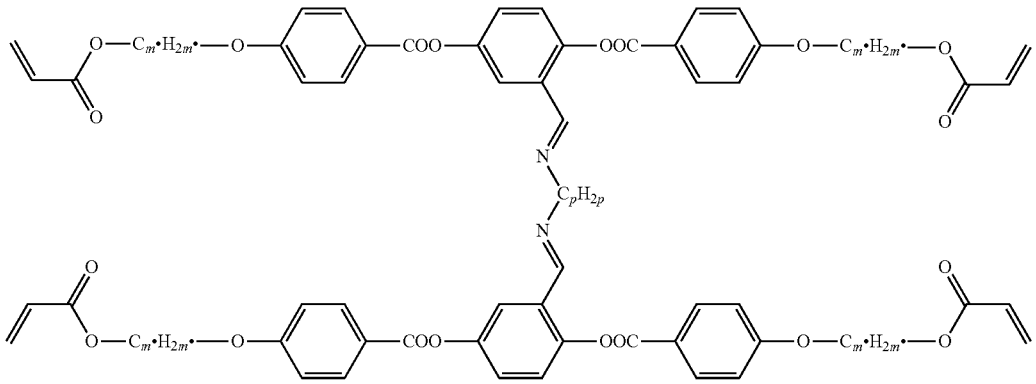
In Chemical Formulae 1A to 1F, m' is an integer of 4 to 12, and p is an integer of 2 to 12.
For example, the liquid crystal 150a may be a compound represented by Chemical Formula 2A.
Chemical Formula 2A
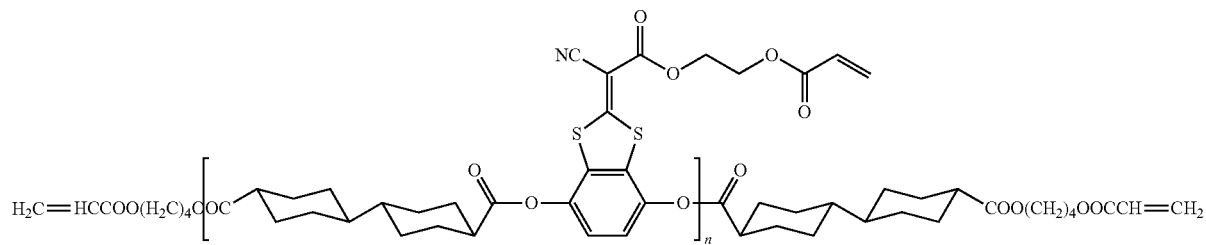
In Chemical Formula 2A, n is an integer of 2 to 10.
For example, the liquid crystal 150a may be a compound represented by one of Chemical Formulae 3A to 3E.
Chemical Formula 3A
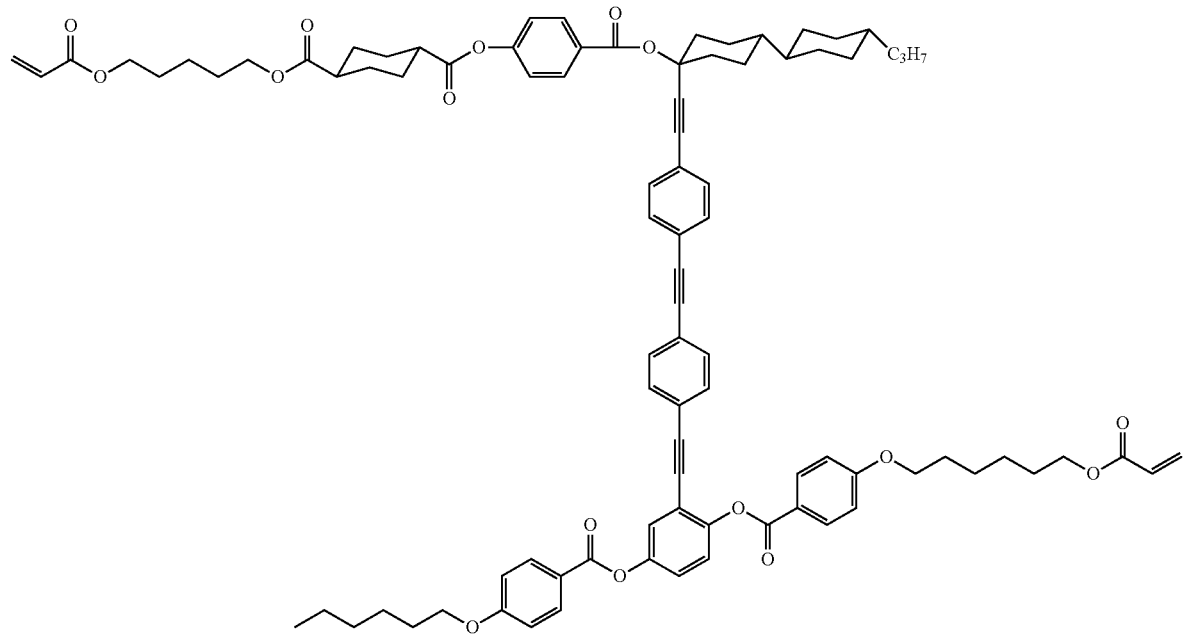

Chemical Formula 3B
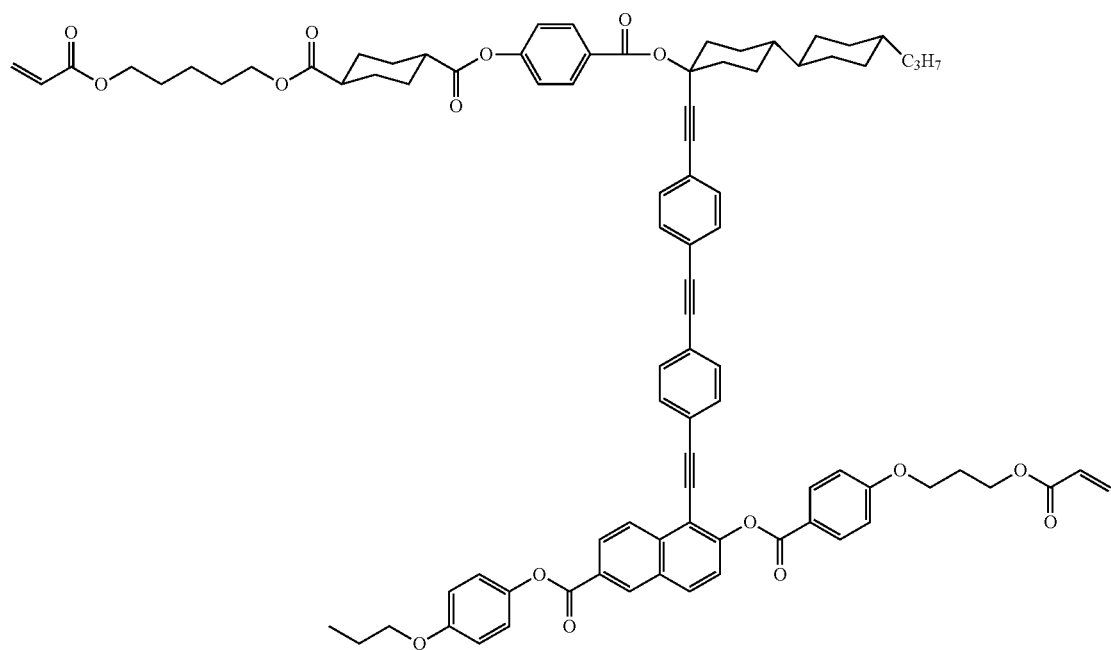
Chemical Formula 3C
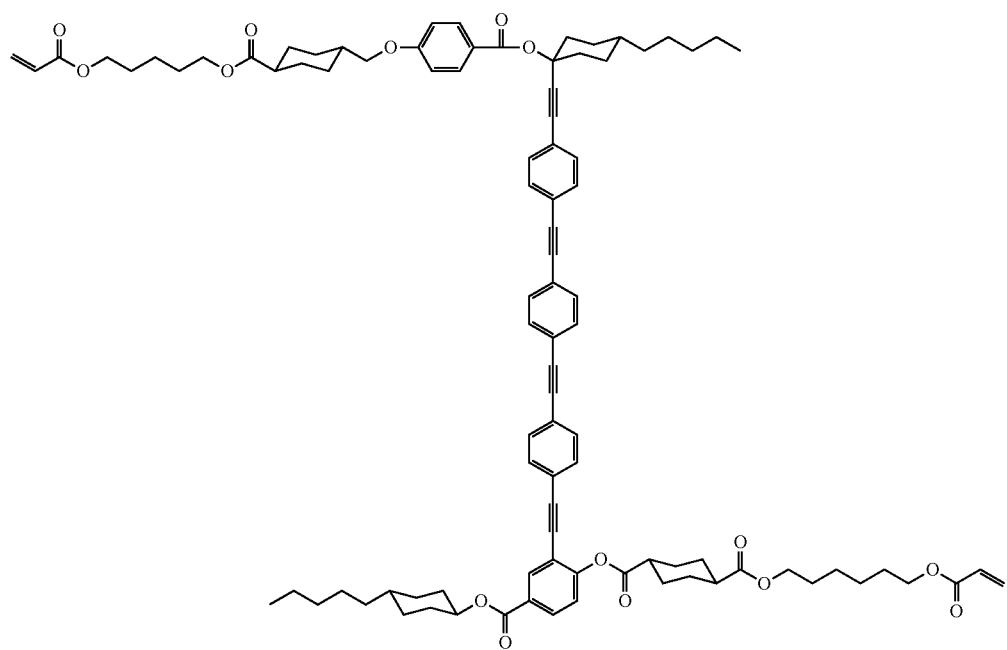

Chemical Formula 3D
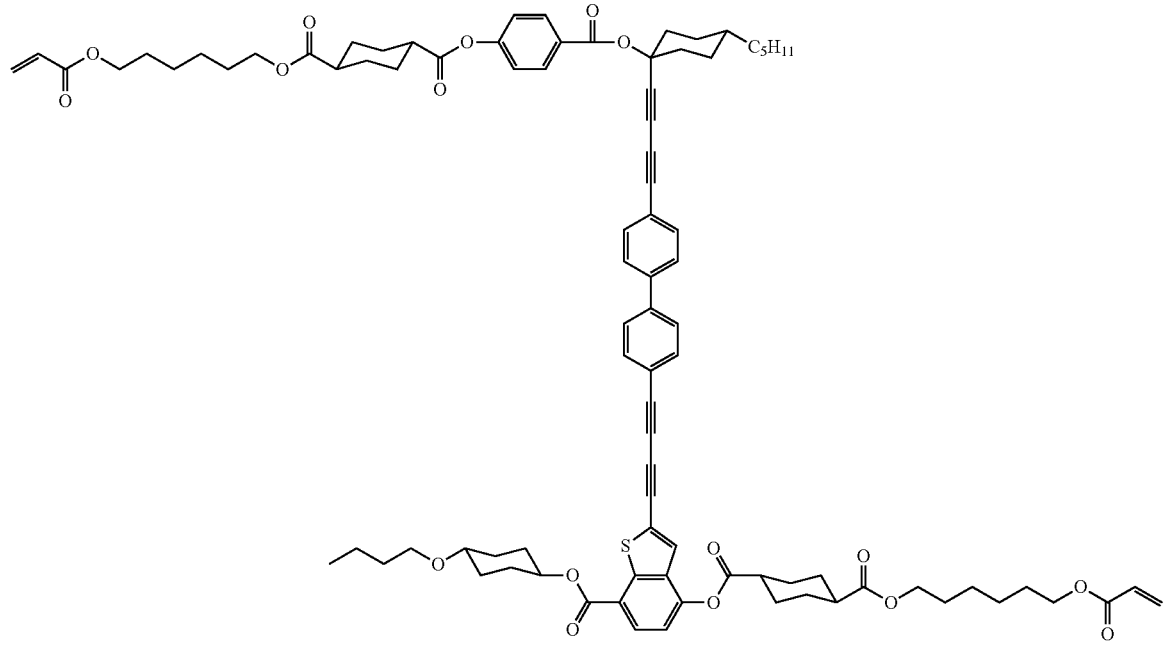
Chemical Formula 3E
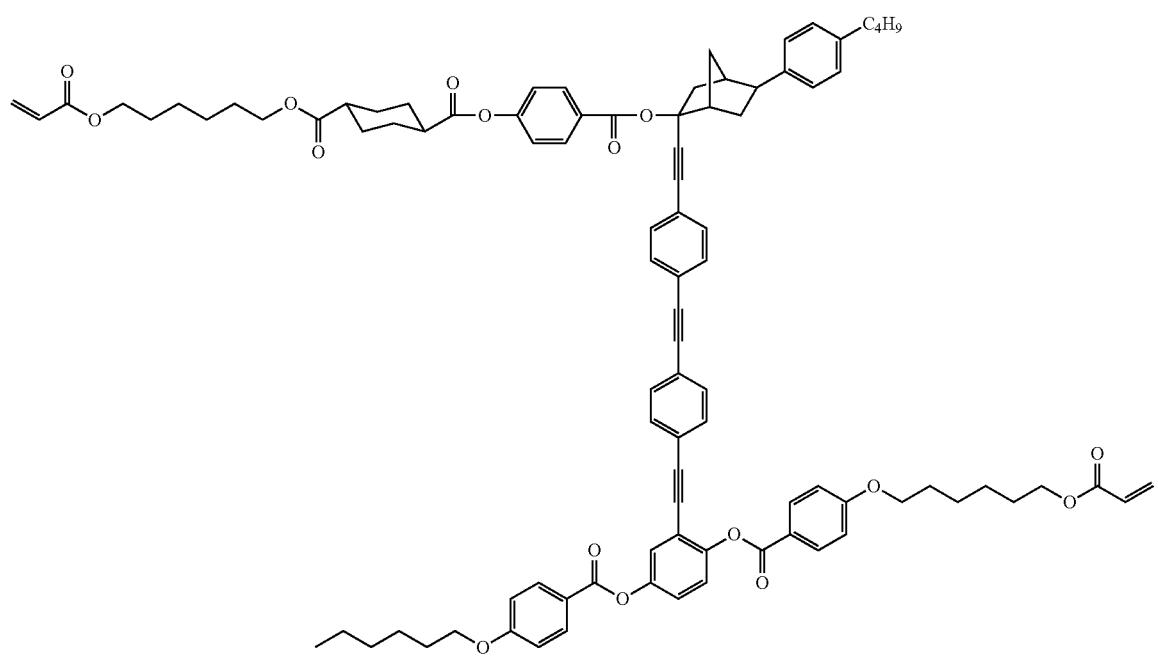
For example, the liquid crystal 150a may be a compound represented by Chemical Formula 4A or 4B.

Chemical Formula 4A

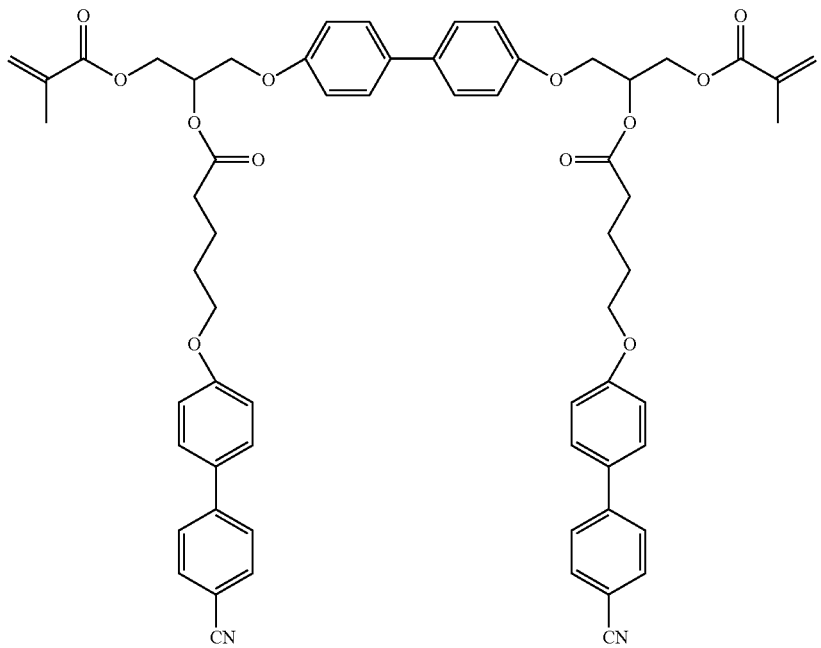

Chemical Formula 4B

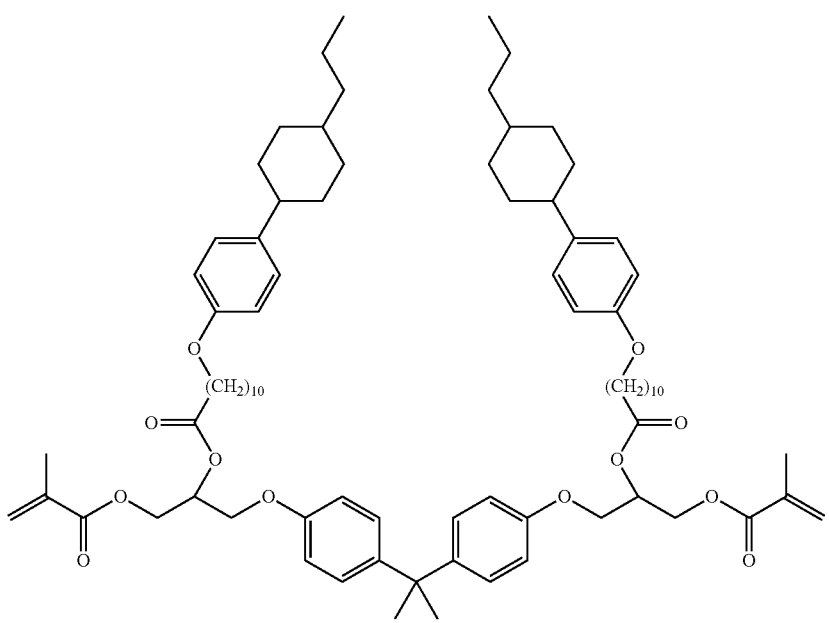

The first liquid crystal layer 150 may include one or more type of liquid crystal 150a.

The first liquid crystal layer 150 may be formed of a liquid crystal composition including the liquid crystal 150a. The liquid crystal composition may further include various additives such as a reaction initiator, a surfactant, a dissolution assistant and/or a dispersing agent, or a solvent, in addition to the liquid crystal 150a. The liquid crystal composition may be applied through a solution process, for example, spin coating, slit coating, and/or inkjet coating, and the thickness of the first liquid crystal layer 150 may be adjusted in consideration of the desired refractive index and the like.

The second compensation film 220 may be disposed on the first compensation film 210, and prevent light leakage at the side direction and as a result, viewing angle dependency of the first compensation film 210 may be further improved.

The second compensation film 220 may be, for example a polymer film or a film including a liquid crystal layer (hereinafter, referred to as 'second liquid crystal layer'). When the second compensation film 220 is a polymer film, it may be a uniaxially or biaxially elongated film. When the second compensation film 220 is a film including the second liquid crystal layer, it may further include a substrate and an alignment layer on the second liquid crystal layer.

The second compensation film 220 may have a refractive index satisfying Relationship Equations 1 and 2.

$$n_{z2} > n_{x2} \qquad \text{Relationship Equation 1}$$

$$n_{z2} > n_{y2} \qquad \text{Relationship Equation 2}$$

In Relationship Equations 1 and 2, $n_{x2}$ is a refractive index at a slow axis of the second compensation film, $n_{y2}$ is a refractive index at a fast axis of the second compensation film, and $n_{z2}$ is a refractive index in a direction perpendicular to the slow axis and the fast axis of the second compensation film.

The second compensation film 220 may have a refractive index satisfying Relationship Equation 1A.

$$n_{z2} > n_{x2} = n_{y2} \qquad \text{Relationship Equation 1A}$$

In Relationship Equation 1A, the $n_{x2}$ and $n_{y2}$ may be substantially equivalent as well as completely the same. Herein, $n_{x2}$ and $n_{y2}$ are regarded as substantially equivalent when the $n_{x2}$ and $n_{y2}$ have a refractive index difference of less than or equal to about 10 nm, and specifically, less than or equal to about 5 nm.

The second compensation film 220 may have substantial in-plane isotropy by satisfying Relationship Equation 1A.

The second compensation film 220 may have a retardation for incident light. When the second compensation film 220 includes the second liquid crystal layer, retardation of the second compensation film 220 may be substantially the same as retardation of the second liquid crystal layer.

The retardation of the second compensation film 220 may be expressed as in-plane retardation ($R_{e2}$) and thickness direction retardation ($R_{th2}$). The in-plane retardation ($R_{e2}$) of the second compensation film 220 occurs in an in-plane direction and may be expressed as $R_{e2}=(n_{x2}-n_{y2})d_2$. The thickness direction retardation ($R_{th2}$) of the second compensation film 220 occurs in a thickness direction and may be expressed as $R_{th2}=\{[(n_{x2}+n_{y2})/2]-n_{z2}\}d_2$. Herein, the $d_2$ is a thickness of the second compensation film 220.

When the second compensation film 220 is a polymer film, it may have an in-plane retardation and a thickness direction retardation within a predetermined range by changing $n_{x2}$, $n_{y2}$, $n_{z2}$, and/or the thickness $d_2$ of the polymer film.

When the second compensation film 220 includes a second liquid crystal layer, the second liquid crystal layer may include homeotropic liquid crystals.

The second liquid crystal layer may have, for example a retardation for incident light satisfying Relationship Equations 6 and 7.

$$-10 \text{ nm} \leq R_{e2}(550 \text{ nm}) \leq 10 \text{ nm} \qquad \text{Relationship Equation 6}$$

$$-200 \text{ nm} \leq R_{th2}(550 \text{ nm}) < -10 \text{ nm} \qquad \text{Relationship Equation 7}$$

In Relationship Equations 6 and 7, $R_{e2}$ (550 nm) is in-plane retardation of the second liquid crystal layer for incident light at a 550 nm wavelength, and $R_{th2}$ (550 nm) is a thickness direction retardation of the second liquid crystal layer for incident light at a 550 nm wavelength.

Thickness direction retardation may be reduced or offset and viewing angle dependency may be decreased by satisfying Relationship Equations 6 and 7 and thereby a compensation function may be realized.

The second compensation film 220 may have a forward wavelength dispersion retardation or a reverse wavelength dispersion retardation.

The forward wavelength dispersion retardation indicates that a retardation of light at a short wavelength is larger than a retardation of light at a long wavelength. When the second compensation film 220 includes a second liquid crystal layer, the in-plane retardation of the second liquid crystal layer at 450 nm, 550 nm, and 650 nm wavelengths may satisfy, for example Relationship Equations 8 or 9.

$$R_{e2}(450 \text{ nm}) > R_{e2}(550 \text{ nm}) \geq R_{e2}(650 \text{ nm}) \qquad \text{Relationship Equation 8}$$

$$R_{e2}(450 \text{ nm}) \geq R_{e2}(550 \text{ nm}) > R_{e2}(650 \text{ nm}) \qquad \text{Relationship Equation 9}$$

In Relationship Equations 8 and 9, $R_{e2}$ (450 nm) is in-plane retardation of the second liquid crystal layer for incident light at a 450 nm wavelength, $R_{e2}$ (550 nm) is in-plane retardation of the second liquid crystal layer for incident light at a 550 nm wavelength, and $R_{e2}$ (650 nm) is in-plane retardation of the second liquid crystal layer for incident light at a 650 nm wavelength.

The reverse wavelength dispersion retardation has larger retardation of light having a long wavelength than retardation of light having a short wavelength. When the second compensation film 220 includes a second liquid crystal layer, in-plane retardation of incident light by the second liquid crystal layer at 450 nm, 550 nm, and 650 nm wavelengths may satisfy, for example Relationship Equation 10 or 11.

$$R_{e2}(450 \text{ nm}) < R_{e2}(550 \text{ nm}) \leq R_{e2}(650 \text{ nm}) \qquad \text{Relationship Equation 10}$$

$$R_{e2}(450 \text{ nm}) \leq R_{e2}(550 \text{ nm}) < R_{e2}(650 \text{ nm}) \qquad \text{Relationship Equation 11}$$

In Relationship Equations 10 and 11, $R_{e2}$ (450 nm) is in-plane retardation of the second liquid crystal layer for incident light at a 450 nm wavelength, $R_{e2}$ (550 nm) is in-plane retardation of the second liquid crystal layer for incident light at a 550 nm wavelength, and $R_{e2}$ (650 nm) is in-plane retardation of the second liquid crystal layer for incident light at a 650 nm wavelength.

For the optical film according to the present embodiment, light may be circularly-polarized equally in all directions by the first compensation film 120, a contrast ratio is improved at the side direction as well as in the front direction, and generation of color shift may be decreased, resulting in improving side visibility. The second compensation film 220 may prevent light leakage generation at the side direction and thereby viewing angle dependency may be further improved.

Hereinafter, an optical film according to another embodiment is described.

Figure 2:
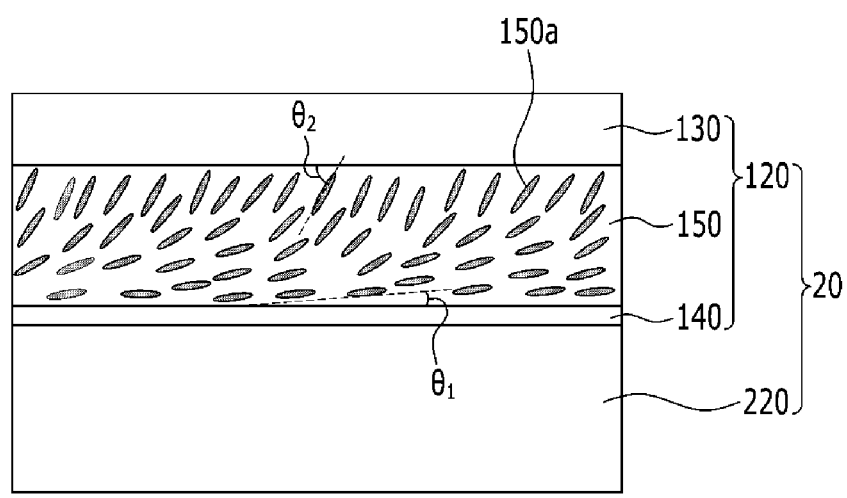
FIG. 2 is a cross-sectional view of an optical film according to another embodiment.

FIG. 2 is a cross-sectional view of an optical film according to another embodiment.

Referring to FIG. 2, an optical film 20 according to the present embodiment includes a first compensation film 120 including a substrate 130, an alignment layer 140, and a first liquid crystal layer 150, and a second compensation film 220, similar to the above embodiment.

However, the optical film 20 according to the present embodiment has a structure in which the liquid crystals 150a of the first liquid crystal layer 150 have a tilt angle growing larger from the bottom to the top. That is, the first liquid crystal layer 150 has a top tilt structure which is unlike the above embodiment. In other words, when the first liquid crystal layer 150 has a first surface contacting an alignment layer 140 and a second surface facing the first surface, tilt angles of the liquid crystals 150a may become gradually larger from the first surface to the second surface.

For example, the tilt angle $\theta_1$ of the liquid crystals 150a at the first surface of the first liquid crystal layer 150 may be a pretilt angle generated by the alignment layer 140. The tilt angle $\theta_1$, for example, may be from greater than about 0° to less than or equal to about 20°. The tilt angle ($\theta_1$) may be, for example, in a range of greater than about 0° and less than or equal to about 15°, greater than about 0° and less than or equal to about 10°, greater than about 0° and less than or equal to about 5°, or from about 2° to about 5°.

The tilt angle $\theta_2$ of the liquid crystals 150a at the second surface of the first liquid crystal layer 150 may be a maximum tilt angle, for example, an angle in a range of about 3° to about 80°. The maximum tilt angle may be, for example, in a range of about 3° to about 75°, about 3° to about 70°, about 3° to about 60°, or about 3° to about 45°.

Hereinafter, an optical film according to another embodiment is described.

Figure 3:
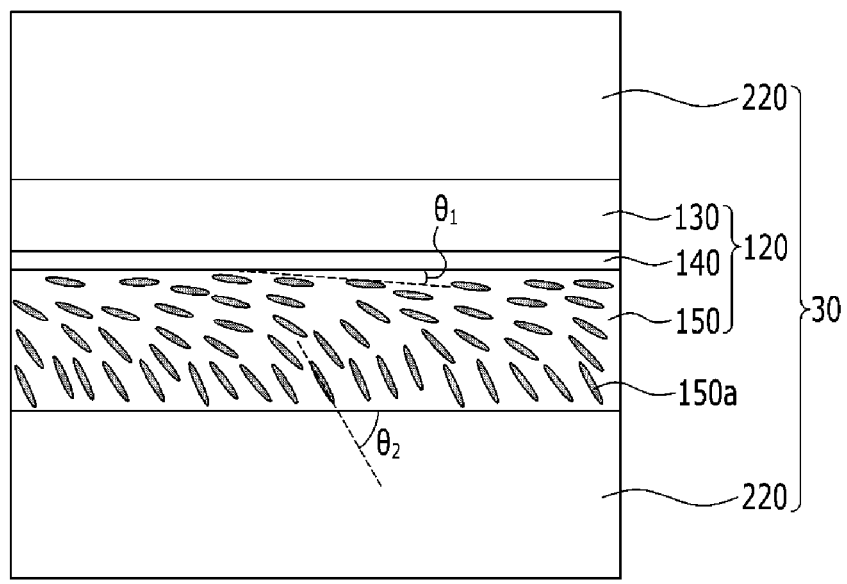
FIGS. 3 and 4 are cross-sectional views of optical films according to another embodiment.
Figure 4:
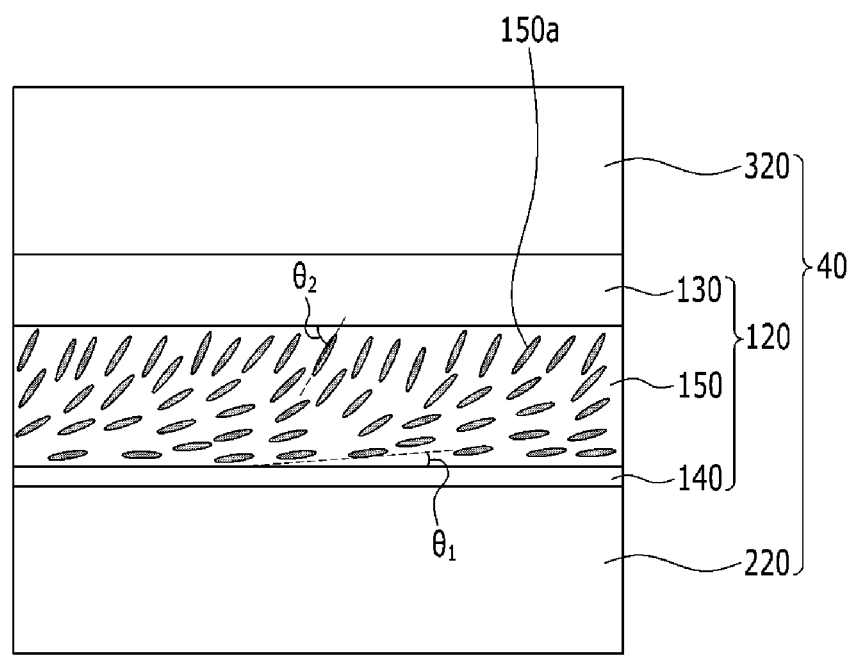

FIGS. 3 and 4 are cross-sectional views of optical films according to another embodiment.

Referring to FIG. 3, an optical film 30 according to the present embodiment includes a first compensation film 120 including a substrate 130, an alignment layer 140, and a first liquid crystal layer 150, and a second compensation film 220 like the optical film 10 of FIG. 1.

Referring to FIG. 4, an optical film 40 according to the present embodiment includes a first compensation film 120 including a substrate 130, an alignment layer 140, and a first liquid crystal layer 150, and a second compensation film 220 like the optical film 20 of FIG. 2.

However, the optical films 30 and 40 shown in FIGS. 3 and 4, each further include a polarizer 320, which is unlike the optical films 10 and 20 shown in FIGS. 1 and 2.

The polarizer 320 may be made of, for example, elongated polyvinyl alcohol (PVA) prepared by a method of, for example, drawing a polyvinyl alcohol film, adsorbing iodine or a dichroic dye thereto, treating it with boric acid, and washing the same.

The polarizer 320 may be, for example, a polarizing film prepared by melt-blending a polymer and a dichroic dye. For example, the polarizing film may be, for example, made by mixing a polymer and a dye and melting the mixture at a temperature above the melting point of the polymer and manufacturing it in a form of a sheet.

The polarizer 320 may be combined with the first and second compensation films 120 and 220 to act as an anti-reflective film for external light.

Figure 5:
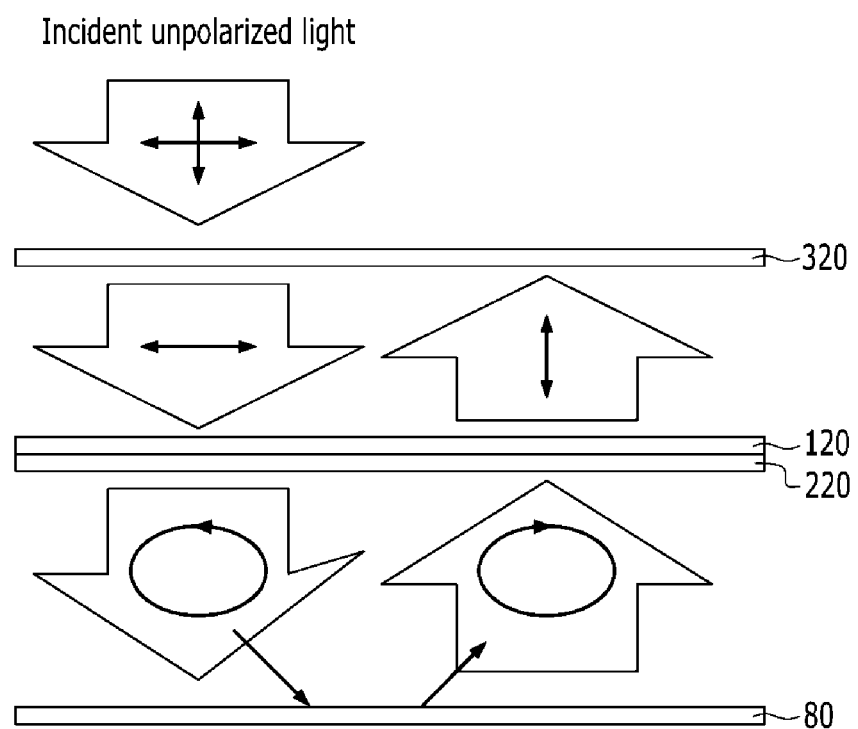
FIG. 5 is a schematic view showing an external light anti-reflection principle for the optical films in FIGS. 3 and 4.

FIG. 5 is a schematic view showing the external light anti-reflection principle of the optical films of FIG. 3 or 4.

Referring to FIG. 5, when the incident unpolarized light (hereinafter referred to as 'external light') having entered from the outside is passed through the polarizer 320, only a first polarized perpendicular component, which is one polarized perpendicular component of two polarized perpendicular components, is transmitted. The polarized light is shifted into circularly polarized light as it passes through the first and second compensation films 120 and 220. When the circularly polarized light is reflected in a display panel 80 including a substrate, an electrode, and so on, and the circular polarization direction of the light changes, and the circularly polarized light passes through the second and first compensation films 220 and 120 again, however, only a second polarized perpendicular component, which is the other polarized perpendicular component of the two polarized perpendicular components, may be transmitted. Since the second polarized perpendicular component does not pass through the polarizer 320, and since light does not exit to the outside, external light reflection may be prevented.

Figure 6:
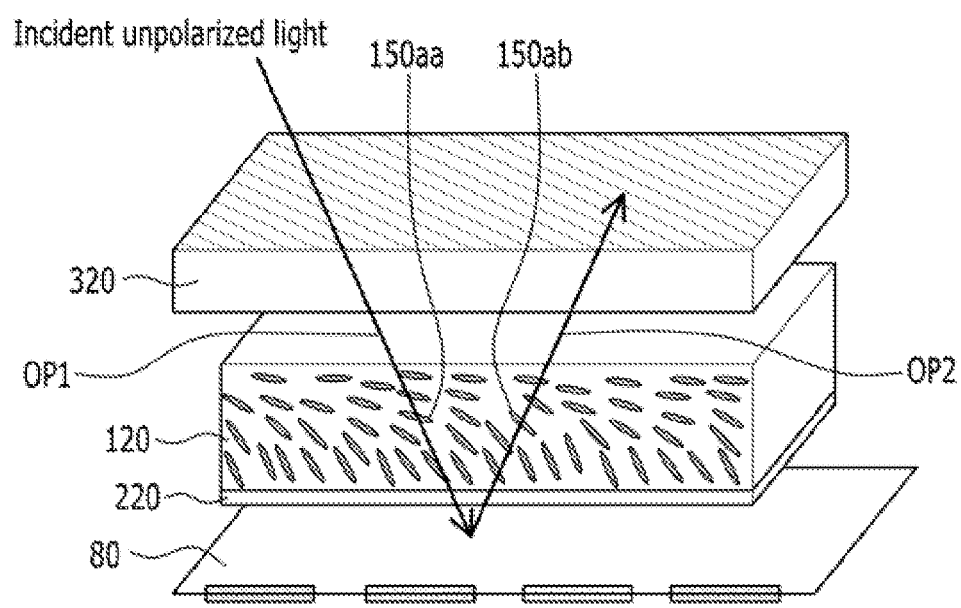
FIG. 6 is a schematic view showing a viewing angle improvement principle for an optical film according to an embodiment.

FIG. 6 is a schematic view showing a viewing angle improvement principle of an optical film according to an embodiment.

Referring to FIG. 6, external light travels through a first optical path OP1 in which the light passes through the first and second compensation films 120 and 220, reaches the display panel 80, is reflected from the display panel 80 along a second optical path OP2, and passes through the second and first compensation films 220 and 120 again. The light has a polarization direction that changes as it travels through the first and second optical paths OP1 and OP2 and does not pass through the polarizer 320, showing an external light anti-reflection effect.

Herein, the first and second optical paths OP1 and OP2 may substantially form a mirror image with reference to the display panel 80. The first compensation film 120 includes liquid crystals that are obliquely tilted and aligned in one direction, but when external light passes sequentially through the first optical path OP1 and the second optical path OP2 having opposite directions from each other, a phase difference may be adjusted by summing the slope alignment of liquid crystals 150aa in the first optical path OP1 and the slope alignment of liquid crystals 150ab in the second optical path OP2. Accordingly, an anti-reflection effect may be substantially equivalent in all directions, and a contrast ratio at the side direction as well as at the front direction is improved and color shift generation may be decreased, resulting in improved side-direction visibility. Furthermore, viewing angle dependency may also be further improved due to the second compensation film 220 and thus side-direction visibility may be improved even further.

In FIG. 6, the optical film of FIG. 3 is shown in the example illustrated, but the optical film of FIG. 4 may also be used and achieve the same effect.

An adhesion layer (not shown) may be further disposed between the polarizer 320 and the first compensation film 120 and/or between the first compensation film 120 and the second compensation film 220. The adhesion layer is used to effectively attach the polarizer 320, the first compensation film 120, and the second compensation film 220, and may be, for example, a pressure sensitive adhesive.

The optical films 30 and 40 may further include a protective layer (not shown) on the polarizer 320. The protective layer may be provided to further reinforce the functionality or improve the durability of the optical films 30 and 40, or to reduce reflection or glare. The protective layer, for example, may be a triacetyl cellulose (TAC) film, but is not limited thereto.

The optical film 30 and 40 may further include a correction layer (not shown). The correction layer may be, for example, a color shift resistant layer, but is not limited thereto.

The optical films 30 and 40 may further include a light blocking layer (not shown) extended along the edge of the optical films 30 and 40. The light-blocking layer may also include a light blocking layer (not shown) extended around the circumference of the optical films 30 and 40. The light-blocking layer may include an opaque material, for example, a black material. For example, the light-blocking layer may be made of a black ink.

The optical films 30 and 40 may be stacked with the polarizer 320, and the first and second compensation films 120 and 220, by a roll-to-roll method, a transfer method, and/or a coating method, but is not limited thereto.

The optical films 10, 20, 30, and 40 may be applied to a display device.

A display device according to an embodiment may include a display panel and the optical films 10, 20, 30, or 40. The display panel may be, for example a liquid crystal panel or an organic light emitting display panel.

Hereinafter, a liquid crystal display (LCD) is described as an example of the display device.

Figure 7:
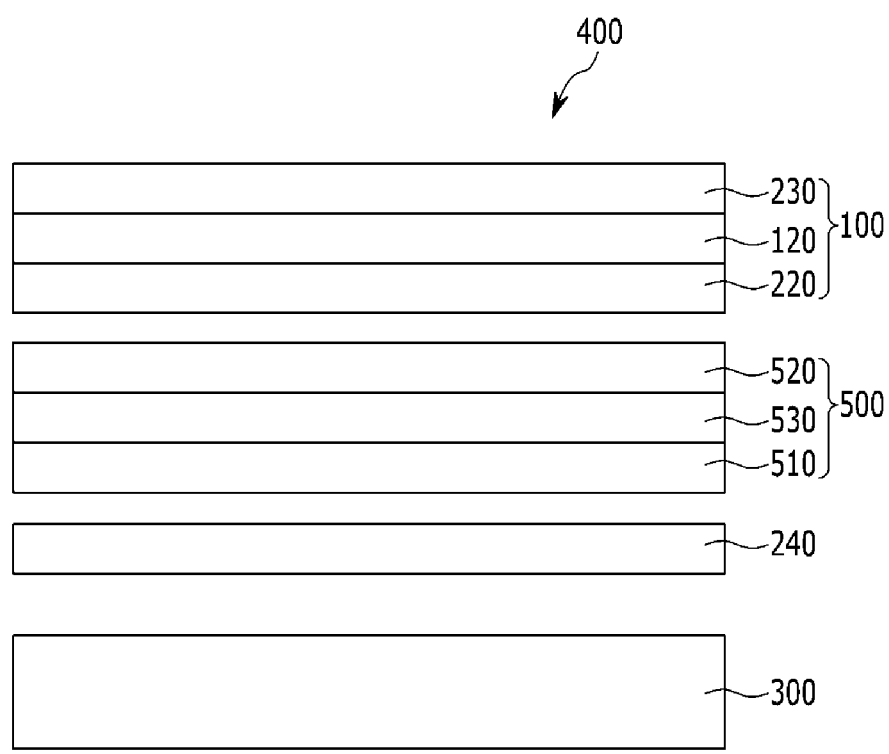
FIG. 7 is a cross-sectional view schematically showing a liquid crystal display according to an embodiment.

FIG. 7 is a cross-sectional view schematically showing a liquid crystal display according to an embodiment.

Referring to FIG. 7, a liquid crystal display (LCD) 400 according to an embodiment includes a light source member 300, a lower polarizer 240, a liquid crystal panel 500, and the optical film 100.

The light source member 300 may include a light source supplying light and optionally, an optical sheet. The light source may include, for example a cold cathode fluorescent lamp (CCFL), a light emitting diode (LED), a quantum dot (QD), and/or the like, and the optical sheet may include for example a prism sheet, a diffuser sheet, a light guide, and/or the like.

The lower polarizer 240 may be, for example, a polyvinyl alcohol (PVA) including iodine and/or a dichroic dye. The lower polarizer 240 may be for example an elongated film. The lower polarizer 240 may for example include a layer formed of polyvinyl alcohol and at least one protective layer such as TAC. The lower polarizer 240 may be, for example, a polarizing film including a polymer and a dichroic dye. The polymer may be, for example, a hydrophobic polymer and include for example, polyolefin.

The liquid crystal panel 500 includes a first display panel 510, a second display panel 520, and a liquid crystal layer 530 between the first display panel 510 and the second display panel 520.

The first display panel 510 may include for example a thin film transistor (not shown) formed on a substrate (not shown), a first field generating electrode (not shown) connected to the thin film transistor, and a second field generating electrode (not shown) positioned apart from the first field generating electrode at a predetermined distance. Herein, an electric field may be applied in a horizontal direction to the first field generating electrode and the second field generating electrode.

The second display panel 520 may include for example a color filter (not shown) formed on the substrate (not shown). However, the present disclosure is not limited thereto, and the color filter may be included in the first display panel 510.

The liquid crystal layer 530 may include a plurality of liquid crystals. The liquid crystals may be arranged in a horizontal direction with respect to the first and second display panels 510 and 520 and may be rotated along an in-plane direction relative to the first and second display panels 510 and 520 when an electric field is applied thereto.

The optical film 100 may be disposed on the liquid crystal panel 500 at a side observed by the viewer. The optical film 100 may include the optical films 10, 20, 30, or 40 as described above.

The optical film 100 may improve a contrast ratio at the side direction and decrease color shift generation, and thus improve side-direction visibility as described above. Accordingly, a liquid crystal display (LCD) having a wide viewing angle may be realized.

Hereinafter, an organic light emitting diode (OLED) display is described as one example of the display device.

Figure 8:
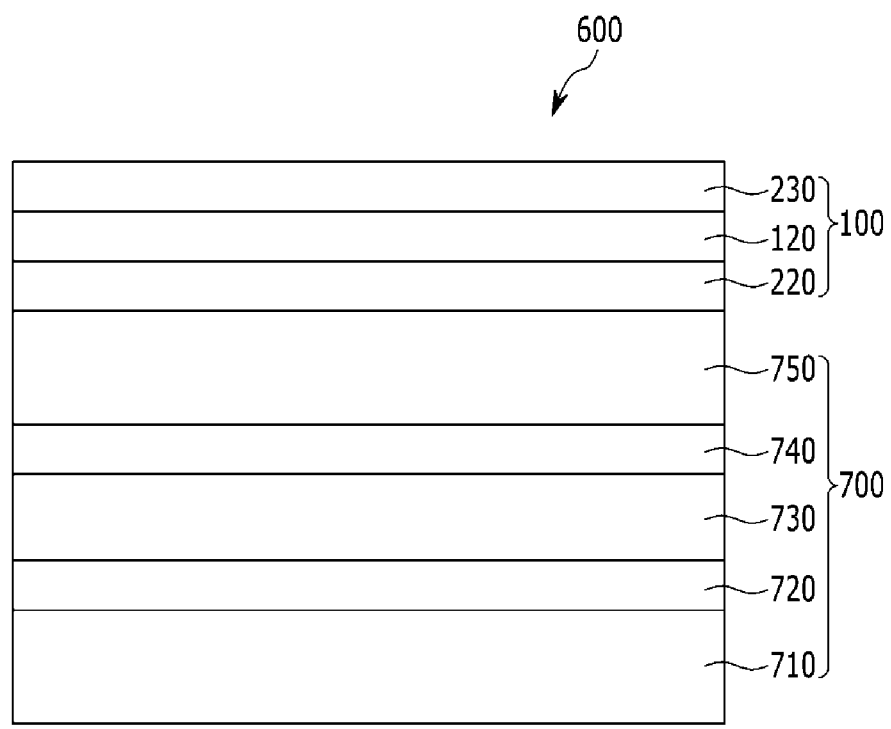
FIG. 8 is a cross-sectional view schematically showing an organic light emitting diode display according to an embodiment.

FIG. 8 is a cross-sectional view schematically showing an organic light emitting diode display according to an embodiment.

Referring to FIG. 8, an organic light emitting diode display 600 according to an embodiment includes an organic light emitting display panel 700 and an optical film 100 on the organic light emitting display panel 700.

The organic light emitting display panel 700 includes a base substrate 710, a lower electrode 720, an organic emission layer 730, an upper electrode 740, and an encapsulation substrate 750.

The base substrate 710 may be made of glass or plastic.

At least one of the lower electrode 720 and the upper electrode 740 may be an anode, and the other may be a cathode. The anode is an electrode into which holes are injected and may be made of a conductive material having a high work function, and the cathode is an electrode into which electrons are injected and may be made of a conductive material having a low work function. At least one of the lower electrode 720 and the upper electrode 740 may be made of a transparent conductive material, for example indium tin oxide (ITO) or indium zin oxide (IZO), from which emitted light exits to the outside of the organic light emitting diode display.

The organic emission layer 730 includes an organic material which may emit light when applying a voltage to the lower electrode 720 and the upper electrode 740.

An auxiliary layer (not shown) may be further provided between the lower electrode 720 and the organic emission layer 730 and between the upper electrode 740 and the organic emission layer 730. The auxiliary layer may include a hole transport layer, a hole injection layer, an electron injection layer, and an electron transport layer in order to balance electrons and holes, but is not limited thereto.

The encapsulation substrate 750 may be made of glass, metal, or a polymer, and may seal the lower electrode 720, the organic emission layer 730, and the upper electrode 740 to prevent moisture and/or oxygen inflow from the outside.

The optical film 100 may include the optical films 10, 20, 30, or 40, and may be disposed on the side emitting light. For example, in the case of a bottom emission structure emitting light at the side of the base substrate 710, the optical film 100 may be disposed on the exterior side of the base substrate 710, while on the other hand, in the case of a top emission structure emitting light at the side of the encapsulation substrate 750, the optical film 100 may be disposed on the exterior side of the encapsulation substrate 750.

The optical film 100 may prevent external light from being reflected by a metal such as an electrode within the organic light emitting display panel 700 and from being emitted outside of the organic light emitting diode display. As a result, the display characteristics of the organic light emitting diode display are improved.

In addition, the optical film 100 may show a substantially equivalent anti-reflection effect in all directions and may also effectively prevent a color shift due to refection of external light at the side direction as well as at the front direction as described above, and thus improve side-direction visibility. Accordingly, an organic light emitting diode (OLED) display having a wide viewing angle may be realized.

Hereinafter, the present disclosure is illustrated in more detail with reference to examples. However, these examples are exemplary, and the present disclosure is not limited thereto.

Manufacture of Optical Film

Preparation Example 1

A polyimide alignment layer is formed by coating polyamic acid (Sunever SE-7492, Nissan Chemical Industries Ltd.) on a glass substrate and curing it at 200° C. for 1 hour. Subsequently, the surface of the polyimide alignment layer is rubbed. On the rubbed polyimide alignment layer, a first liquid crystal layer is formed by spin-coating ultraviolet (UV) light curable liquid crystals (RMS03-011, Merck & Co.) at 1100 rotations per minute (rpm) for 15 seconds and pre-baked at 80° C. After setting the temperature of the substrate at 50° C., the first liquid crystal layer is irradiated by 500 millijoules (mJ) of UV light to cure the liquid crystals, forming a first compensation film including the tilted liquid crystals against the surface.

On the other hand, a second liquid crystal layer is formed by coating liquid crystals (RMS03-015, Merck & Co.) on a non-elongated polycarbonate substrate and pre-baking them. Subsequently, a second compensation film including the liquid crystals aligned substantially in a vertical direction, is formed by irradiating 500 mJ of UV light onto the second liquid crystal layer and curing the liquid crystals.

Then, an optical film is manufactured by applying an adhesive on both sides of the first compensation film and attaching the second compensation film on one surface of the first compensation film and a polarizer (SEG1425DU, Nitto Denko) on the other surface of the first compensation film.

Comparative Preparation Example 1

A polyimide alignment layer is formed by coating polyamic acid (Sunever SE-7492, Nissan Chemical Industries Ltd.) on a glass substrate and coating it at 200° C. for one hour. Subsequently, the surface of the polyimide alignment layer is rubbed. On the rubbed polyimide alignment layer, a first liquid crystal layer is formed by spin-coating UV curable liquid crystals (RMS03-013C, Merck & Co.) at 1200 rpm for 15 seconds and pre-baking them at 80° C. After setting the temperature of the substrate at 50° C., an A plate compensation film is formed by radiating 500 mJ of UV into the first liquid crystal layer and curing the liquid crystals.

On the other hand, a second liquid crystal layer is formed by coating liquid crystals (RMS03-015, Merck & Co.) on a non-elongated polycarbonate substrate and pre-baking them. Subsequently, a second compensation film including the liquid crystals aligned substantially in a vertical direction is formed by irradiating 500 mJ of UV on the second liquid crystal layer to cure the liquid crystals.

Subsequently, an optical film is manufactured by applying an adhesive on both surfaces of the first compensation film and then attaching the second compensation film on one surface of the first compensation film and a polarizer (SEG1425DU, Nitto Denko) on the other surface of the first compensation film.

Manufacture of Organic Light Emitting Diode (OLED) Display

Example 1

An organic light emitting display panel is manufactured to have a structure including a metallic anode, an organic emission layer light including an emitting material, a cathode including a transparent conductive material, and a second substrate sequentially stacked on a first substrate formed of a glass material. Subsequently, the optical film according to Preparation Example 1 is attached to the organic light emitting display panel to face each other, manufacturing an organic light emitting diode (OLED) display.

Comparative Example 1

An organic light emitting diode (OLED) display is manufactured according to the same method as Example 1 except that the optical film according to Comparative Preparation Example 1 was used instead of the optical film according to Preparation Example 1.

Evaluation 1

Reflectance and color sense change of the organic light emitting diode (OLED) displays according to Example 1 and Comparative Example 1 are evaluated by using a spectrum colorimeter (DMS 803, Konica Minolta Inc.) while the organic light emitting diode (OLED) displays are supplied with light under a condition of reflection of 45° and a light-receiving region of 2° using D65 as a light source.

The results are provided in Table 1.

TABLE 1

|  | Reflectance at a side direction (%) | Changes of color sense at a side direction ($\Delta a^*b^*$)** |
|---|---|---|
| Example 1 | 1.3 | 11.7 |
| Comparative Example 1 | 1.6 | 15.0 |

Color sense change in Table 1 was calculated using the following equation:

$$\Delta a^* b^* = \sqrt{a^{*2} + b^{*2}}$$

Referring to Table 1, the organic light emitting diode (OLED) display according to Example 1 shows satisfactory reflectance and color sense change at a side direction as compared with the organic light emitting diode display according to Comparative Example 1.

Evaluation 2

An optical film manufactured by attaching a first compensation film including a liquid crystal layer and the second compensation film is set, and its contrast ratio at a side direction depending on the tilt angle of liquid crystals in the liquid crystal layer, is calculated.

The liquid crystals of the first compensation film is set to have a tilt angle gradually changing from greater than 0° to 3° along a thickness direction from the bottom of the first compensation film to the top thereof (Example 2), gradually changing from 3° to greater than 0° (Example 3), gradually changing from 1° to 5° (Example 4), and having no tilt of 0° (Comparative Example 2), and the liquid crystals of the second compensation film are vertically aligned (a tilt angle=90°).

A simulation is performed by stacking a LC-IPS liquid crystal layer, an isotropic protective layer, and a polyvinyl alcohol polarization film in order on a surface of each optical film, and herein, the absorption axes of upper and lower polarization films are set at 90° with respect to each other.

The liquid crystal layer uses liquid crystal in-plane switching ("LC-IPS") of the Techwiz program, and the polyvinyl alcohol polarization film is set to have transmittance of about 42.7% and a polarization degree of about 99.9%.

A contrast ratio at 40° and 80° (at a side direction) is calculated by respectively applying the optical films to a liquid crystal display panel (PLS) in a coplanar electrode (CE) mode, setting each liquid crystal display (LCD) using the liquid crystal display panel (PLS), and using a Techwiz (Sanayi System Co., Ltd.) program.

The contrast ratio (CR) is expressed in the following equation.

$$CR = T_{Bright} / T_{Dark} \quad \text{(Equation)}$$

$T_{Bright}$: Transmittance in a bright state
$T_{Dark}$: Transmittance in a dark state The results are shown in Table 2.

TABLE 2

| | Tilt angle | | Contrast ratio (Polar angle) | | |
|---|---|---|---|---|---|
| | First compensation film | Second compensation film | 0° | 40° | 80° |
| Example 2 | Gradually changing from greater than 0° to 3° | 90° | 1469 | 530 | 72 |
| Example 3 | Gradually changing from 3° to greater than 0° | 90° | 1469 | 480 | 73 |
| Example 4 | Gradually changing from 1° to 5° | 90° | 1469 | 705 | 97 |
| Comparative Example 2 | 0 | 90° | 1469 | 338 | 53 |

Referring to Table 2, the liquid crystal displays (LCD) according to Examples 2 to 4 show an equivalent contrast ratio at a front direction as the contrast ratio of the liquid crystal display (LCD) according to Comparative Example 2, but shows a remarkably improved contrast ratio at a side direction (40° and 80°). Accordingly, the compensation function of the liquid crystal displays (LCD) of Examples 2 to 4 at the side direction may be reinforced. However, this result is based on a premise that the liquid crystal layer of the liquid crystal display panel (plane line switching, "PLS") in a coplanar electrode (CE) mode has only a little tilt, considering possibility that the liquid crystal layer may be tilted depending on a pixel shape and the like.

While this disclosure has been described in connection with what is presently considered to be practical exemplary embodiments, it is to be understood that the invention is not limited to the disclosed embodiments, but rather, is intended to cover various modifications and equivalent arrangements included within the spirit and scope of the appended claims.

What is claimed is:

1. An optical film comprising
a first compensation film and a second compensation film having a retardation of incident light different from the first compensation film,
wherein the first compensation film comprises a first liquid crystal layer comprising liquid crystals which are obliquely tilted relative to a surface of the first compensation film
the second compensation film has a refractive index satisfying Relationship Equation 1 and Relationship Equation 2:

$$n_{z2} > n_{x2} \quad \text{Relationship Equation 1}$$

$$n_{z2} > n_{y2} \quad \text{Relationship Equation 2}$$

wherein, in Relationship Equations 1 and 2,
$n_{x2}$ is a refractive index at a slow axis of the second compensation film,
$n_{y2}$ is a refractive index at a fast axis of the second compensation film, and
$n_{z2}$ is a refractive index in a direction perpendicular to the slow axis and to the fast axis of the second compensation film,
an in-plane retardation for incident light of the first ligand crystal layer 450 nanometer, 550 nanometer, and 650 nanometer wavelength satisfying Relationship Equation 3 or Relationship Equation 4;

$$R_{e1}(450 \text{ nm}) < R_{e1}(550 \text{ nm}) \leq R_{e1}(650 \text{ nm}) \quad \text{Relationship Equation 3}$$

$$R_{e1}(450 \text{ nm}) \leq R_{e1}(550 \text{ nm}) < R_{e1}(650 \text{ nm}) \quad \text{Relationship Equation 4}$$

wherein in Relationship Equations 3 and 4,
$R_{e1}$ (450 nm) is in-plane retardation of the first liquid crystal layer for incident light at a 450 nm wavelength,
$R_{e1}$ (550 nm) is in-plane retardation of the first liquid crystal layer for incident light at a 550 nm wavelength, and
$R_{e1}$ (650 nm) is in-plane retardation of the first liquid crystal layer for incident light at a 650 nanometer wavelength.

2. The optical film of claim 1, wherein the first liquid crystal layer has a first surface and a second surface, and tilt angles of the liquid crystals are gradually larger from the first surface to the second surface.

3. The optical film of claim 2, wherein tilt angles of the liquid crystals are greater than about 0° and less than or equal to about 60°.

4. The optical film of claim 2, wherein tilt angles of the liquid crystals are greater than about 0° and less than or equal to about 45°.

5. The optical film of claim 2, wherein the first surface of the first liquid crystal layer is disposed at a surface of the second compensation film.

6. The optical film of claim 2, wherein the second surface of the first liquid crystal layer is disposed at a surface of the second compensation film.

7. The optical film of claim 1, wherein the first compensation film further comprises an alignment layer contacting the first liquid crystal layer.

8. The optical film of claim 1, wherein the first compensation film has an in-plane retardation for incident light of about 110 nanometers to about 160 nanometers.

9. The optical film of claim 1, wherein an in-plane retardation for incident light of the liquid crystal layer at 450 nanometer, 550 nanometer, and 650 nanometer wavelengths satisfies Relationship Equation 5:

$$0.7 \leq R_{e1}(450 \text{ nm})/R_{e1}(550 \text{ nm}) < 1.0 \quad \text{Relationship Equation 5}$$

wherein, in Relationship Equation 5,
$R_{e1}$ (450 nm) is an in-plane retardation of the first liquid crystal layer for incident light at a 450 nanometer wavelength, and
$R_{e1}$ (550 nm) is an in-plane retardation of the first liquid crystal layer for incident light at a 550 nanometer wavelength.

10. The optical film of claim 1, wherein the second compensation film is an elongated polymer film.

11. The optical film of claim 1, wherein the second compensation film comprises a second liquid crystal layer comprising homeotropic liquid crystals.

12. The optical film of claim 11, wherein the second liquid crystal layer has retardations satisfying Relationship Equations 6 and 7:

$$-10 \text{ nm} \leq R_{e2}(550 \text{ nm}) \leq 10 \text{ nm} \quad \text{Relationship Equation 6}$$

$$-200 \text{ nm} \leq R_{th2}(550 \text{ nm}) < -10 \text{ nm} \quad \text{Relationship Equation 7}$$

wherein, in Relationship Equations 6 and 7,
$R_{e2}$(550 nm) is an in-plane retardation for incident light of the second liquid crystal layer for incident light at a 550 nanometer wavelength, and $R_{th2}$ (550 nm) is a thickness direction retardation for incident light of the second liquid crystal layer for incident light at a 550 nanometer wavelength.

13. The optical film of claim 11, wherein in-plane retardation for incident light of the second liquid crystal layer at 450 nanometer, 550 nanometer, and 650 nanometer wavelengths satisfies any one of Relationship Equations 8 to 11:

$$R_{e2}(450\ nm) > R_{e2}(550\ nm) \geq R_{e2}(650\ nm) \quad \text{Relationship Equation 8}$$

$$R_{e2}(450\ nm) \geq R_{e2}(550\ nm) > R_{e2}(650\ nm) \quad \text{Relationship Equation 9}$$

$$R_{e2}(450\ nm) < R_{e2}(550\ nm) \leq R_{e2}(650\ nm) \quad \text{Relationship Equation 10}$$

$$R_{e2}(450\ nm) \leq R_{e2}(550\ nm) < R_{e2}(650\ nm) \quad \text{Relationship Equation 11}$$

wherein, in Relationship Equations 8 to 11, $R_{e2}$ (450 nm) is an in-plane retardation of the second liquid crystal layer for incident light at a 450 nanometer wavelength, $R_{e2}$ (550 nm) is an in-plane retardation of the second liquid crystal layer for incident light at a 550 nanometer wavelength, and $R_{e2}$ (650 nm) is an in-plane retardation of the second liquid crystal layer for incident light at a 650 nanometer wavelength.

14. The optical film of claim 1, further comprising a polarizer on the first compensation film or on the second compensation film.

15. A display device comprising
a display panel, and
the optical film of claim 1.

16. The display device of claim 15, wherein
the display panel is a liquid crystal panel, and
the liquid crystal panel comprises
a first panel and a second panel facing each other and
a liquid crystal layer disposed between the first panel and the second panel and comprising liquid crystals tilted in an in-plane direction relative to the first panel and the second panel when an electric field is present in the display device.

17. The display device of claim 15, wherein the display panel is an organic light emitting display panel.

* * * * *